United States Patent [19]
Naem

[11] Patent Number: 5,911,114
[45] Date of Patent: Jun. 8, 1999

[54] METHOD OF SIMULTANEOUS FORMATION OF SALICIDE AND LOCAL INTERCONNECTS IN AN INTEGRATED CIRCUIT STRUCTURE

[75] Inventor: Abdalla Aly Naem, Sunnyvale, Calif.

[73] Assignee: National Semiconductor Corporation, Santa Clara, Calif.

[21] Appl. No.: 08/822,301

[22] Filed: Mar. 21, 1997

[51] Int. Cl.⁶ .................................................. H01L 21/44
[52] U.S. Cl. ......................... 438/684; 438/655; 438/660
[58] Field of Search ...................................... 438/684, 685, 438/655, 656, 649, 651, 660, 658

[56] References Cited

U.S. PATENT DOCUMENTS

| | | |
|---|---|---|
| 4,920,073 | 4/1990 | Wei et al. . |
| 5,010,032 | 4/1991 | Tang et al. . |
| 5,236,868 | 8/1993 | Nulman . |
| 5,302,539 | 4/1994 | Haken et al. . |
| 5,451,545 | 9/1995 | Ramaswami et al. . |
| 5,567,651 | 10/1996 | Berti et al. . |
| 5,612,253 | 3/1997 | Farahani et al. . |

*Primary Examiner*—Caridad Everhart
*Attorney, Agent, or Firm*—Limbach & Limbach LLP

[57] ABSTRACT

A method of simultaneously forming refractory metal salicide and a local interconnect proceeds, after the standard formation of N+ and P+ junctions, by depositing titanium and TiN films and annealing the structure in nitrogen ambient to form a salicide film on the exposed source, drain and gate regions. A local interconnect mask is then employed to form local interconnect resist patterns. The TiN and unreacted titanium film are then etched off using a wet strip without attacking either salicide or field oxide. Following the etch, the salicide and local interconnect are again subjected to a rapid thermal anneal in a nitrogen ambient to reduce the sheet resistance of the salicide and the local interconnect and to convert the remaining titanium in the local interconnect into TiN film. The process flow can also be applied if cobalt is used instead of titanium and the cobalt is covered with a TiN cap.

5 Claims, 2 Drawing Sheets

METHOD OF SIMULTANEOUS FORMATION OF SALICIDE AND LOCAL INTERCONNECTS IN AN INTEGRATED CIRCUIT STRUCTURE

BACKGROUND OF THE INVENTION

1. Field of the Invention

The present invention relates to the fabrication of semiconductor integrated circuit structures and, in particular, to a method of simultaneously forming salicide and local interconnects in MOS technologies.

2. Discussion of the Related Art

U.S. Pat. No. 5,010,032, issued Apr. 23, 1991, discloses a process for making CMOS devices that include retractery metal nitride interconnect layers. In particular, the '032 patent discloses a process flow in which titanium is deposited on the source/drain regions and adjacent oxide and then heated in a nitrogen-bearing atmosphere by rapid thermal processing (RTP) to form TiN on the oxide and a stacked $TiN/TiSi_2$ layer on the source/drain regions.

The process of the '032 patent can result in formation of non-uniform silicide due to oxide guttering, i.e. attraction of oxide into the silicide during silicide formation. Nitrogen can also diffuse into the titanium during the RTP step with deleterious effects.

U.S. Pat. No. 5,567,651, issued Oct. 22, 1996, discloses a process for forming cobalt silicide on the source/drain regions and polysilicon gate areas of an MOS device. A titanium nitride film is deposited on a cobalt film following the patterning of the polysilicon gate, source/drain implant and sidewall spacer formation. Following rapid thermal processing, which converts the cobalt to CoSi, a selective etch is performed to remove the TiN layer and unreacted cobalt. A second heat treatment is then performed to convert the CoSi to the low-resistivity $CoSi_2$ phase.

SUMMARY OF THE INVENTION

The present invention provides a simple, economical method of forming a good salicide layer and a local interconnect layer at the same time. The method is based upon sequentially depositing a titanium layer and a TiN cap in-situ, both in high vacuum, without breaking vacuum.

In accordance with the steps of the inventive method, after proceeding through the conventional N+ junction anneal, a titanium film and a TiN film are sequentially deposited and annealed in a nitrogen ambient to form a salicide film on the exposed source, drain and gate regions. A local interconnect mask is then employed to form local interconnect resist patterns. Unwanted TiN and unreacted titanium film are then etched off without attacking either the salicide or the field oxide. Following the etch, the resulting salicide and local interconnects are annealed, again in nitrogen ambient, to reduce the sheet resistance of the salicide and the local interconnects and to convert the titanium film on the field oxide into TiN film.

The presence of the TiN cap on the titanium film during the first anneal helps form a uniform low resistance titanium salicide layer on the source/drain/gate regions. This is due to the fact that the TiN cap protects the titanium from guttering oxide when it is exposed to the air ambient, especially when the wafers must wait for a time before the next processing step. The presence of oxide in the titanium film requires high rapid thermal processing (RTP) temperatures to form a low resistance salicide film. Additionally, the TiN cap prevents nitrogen diffusion into the titanium film during the initial RTP step, which is performed in nitrogen ambient. Therefore, the initial RTP temperature can be reduced. This makes the formation of lower resistance salicide film on narrow lines much easier. Furthermore, the TiN cap prevents titanium conversion into thermal TiN during the RTP step and, therefore, the salicide layer interface is more uniform compared to conventional techniques. The same TiN cap and the underlying titanium film can be used as a local interconnect layer when the local interconnect mask is applied and unwanted TiN and unreacted titanium are removed.

In an alternate embodiment of the invention, the above process flow can be utilized with replacement of titanium by cobalt with formation of the TiN cap on the cobalt salicide. Cobalt salicide has been investigated extensively because of its following advantages. First, it is less sensitive to dopants than titanium salicide. Second, during salicide formation, cobalt diffuses into silicon, thereby reducing the risk of bridging that causes shorts between source/drain regions and gate regions. Third, cobalt salicide has similar or better contact resistance to n+ or p+ silicon than titanium salicide. Fourth, cobalt salicide offers high etch selectivity over titanium salicide and, therefore, contact depth differential is not a problem.

These and other features and advantages of the present invention will be better understood and appreciated upon consideration of the following detailed description and accompanying drawings which set forth an illustrative embodiment in which the principles of the invention are utilized.

DETAILED DESCRIPTION OF THE DRAWINGS

FIGS. 1A–1E are partial cross-sectional drawings illustrating a sequence of steps for simultaneously fabricating metal salicide and local interconnects.

DETAILED DESCRIPTION OF THE INVENTION

A process flow for simultaneously fabricating titanium salicide and local interconnects in a semiconductor integrated circuit structure, in accordance with the concepts of the present invention, will now be described in conjunction with the partial cross-sectional drawings provided in FIGS. 1A–1E. While specific process parameters are not provided in all cases, those skilled in the art will appreciate that the concepts of the invention are applicable regardless of these parameters, which will differ depending upon the specific integrated circuit structure under manufacture.

Figure 1A:
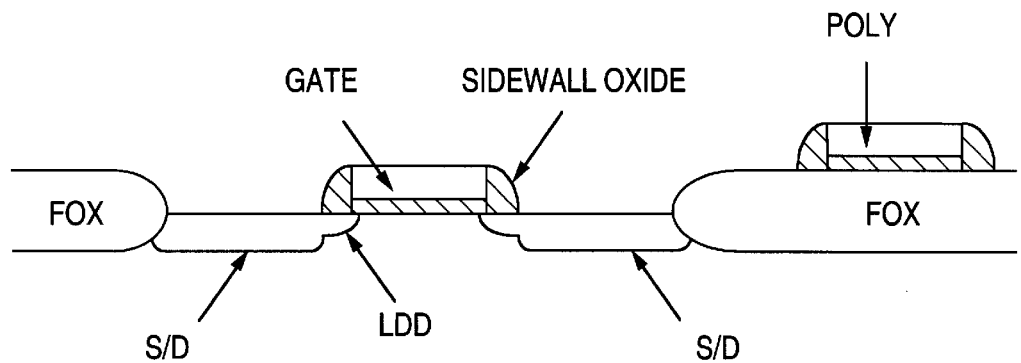

The initial fabrication sequence in accordance with the present invention proceeds in a conventional manner through the formation of the p+ and n+ junctions in a conventional MOS technology configuration, as illustrated in FIG. 1A. Formation of the p+ and n+ junctions is followed by a standard pre-clean step. In FIG. 1A, a polysilicon resistor is shown formed over the field oxide region.

Figure 1B:
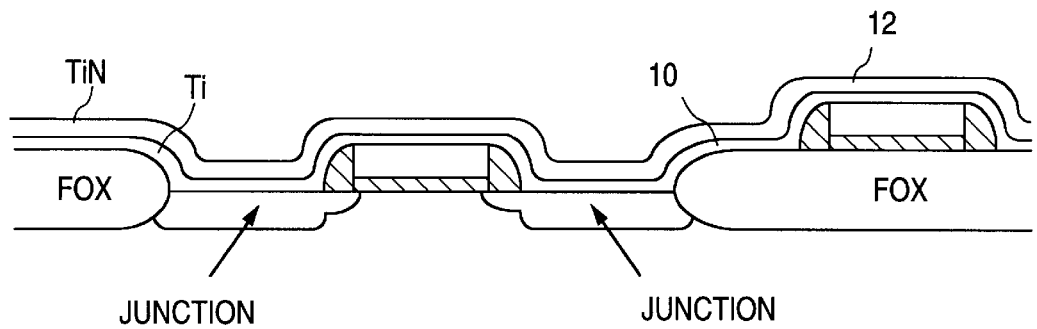
Figure 1C:
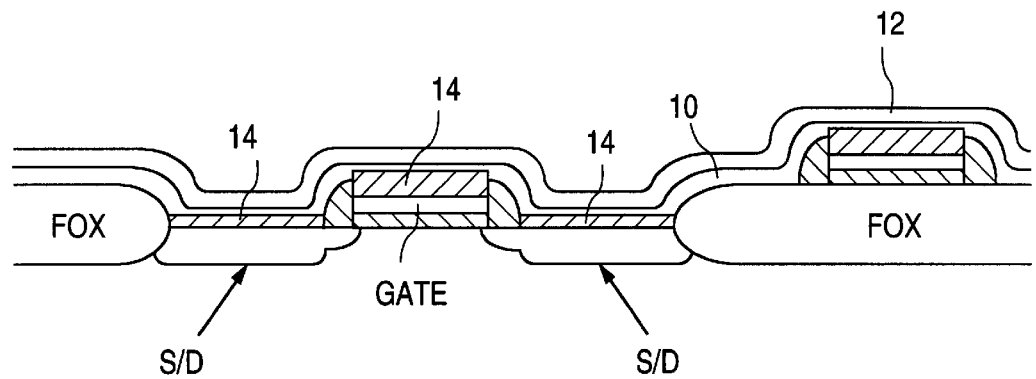

Referring to FIG. 1B, after the junction anneal, in accordance with the present invention, a layer 10 of titanium about 500 Å thick is deposited on the FIG. 1A structure, followed by deposition of a 500 Å layer 12 of TiN film in-situ without breaking vacuum. The titanium film 10 and the TiN film 12 are then annealed in nitrogen ambient at a temperature of about 700° C. for about 60 seconds to form salicide film 14 on the exposed source, drain and gate regions, as shown in FIG. 1C.

Figure 1D:
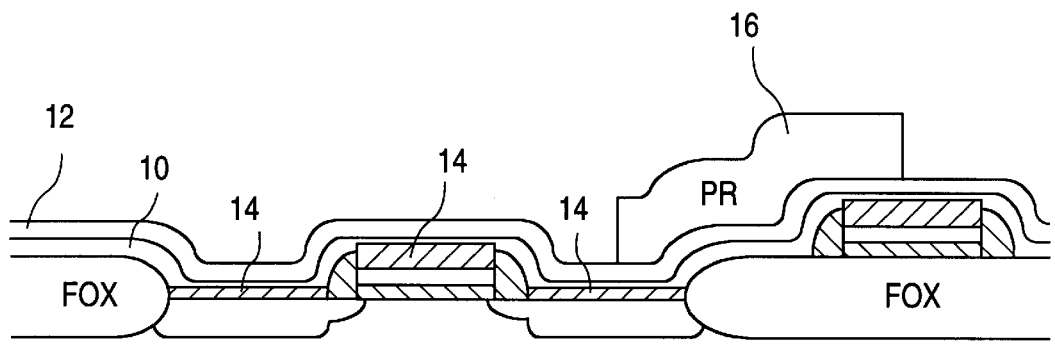
Figure 1E:
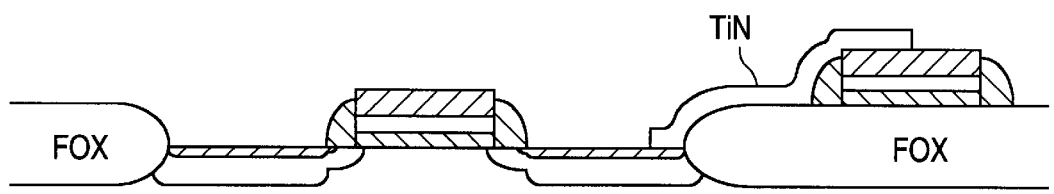

Referring to FIG. 1D, a photoresist local interconnect mask 16 is then employed to form local interconnect resist patterns. Next, exposed TiN 12 and unreacted titanium film are etched off using a wet titanium strip process (for example, $NH_4OH:H_2O_2:H_2O$ in a ratio of 1:1:5) without attacking the salicide and field oxide (FOX) leaving a portion of the TiN film and underlying titanium that extends between the salicide on a source/drain region 14 and the salicide on the resistor. Following the etch, the salicide and interconnect are annealed at 800° C. for 30 seconds, again in nitrogen ambient, to reduce the sheet resistance of the salicide and the local interconnect and to convert the titanium film in the local interconnect into TiN film. The resulting structure is shown in FIG. 1E.

As stated above, the above-described process flow can also be applied if cobalt is used instead of titanium, with a TiN cap sequentially formed on the cobalt in-situ without breaking vacuum.

Also, the local interconnect can be used to shunt the drain and gate areas in a similar fashion.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method of simultaneously forming metal salicide and a local interconnect structure in a semiconductor integrated circuit structure, wherein the semiconductor integrated circuit structure includes first and second spaced-apart source/drain regions formed in an active device region of a silicon substrate, the active device region being defined by field oxide regions formed in the substrate adjacent the active device region, the first and second spaced-apart source/drain regions defining a substrate channel region therebetween, the semiconductor integrated circuit structure further including a conductive gate region formed over the channel region and separated therefrom by a gate oxide layer, the conductive gate region and the gate oxide layer having oxide sidewall spaces formed thereon, the semiconductor integrated circuit structure further including a conductive element, the method comprising:

while maintaining the semiconductor integrated circuit structure in a vacuum, forming a layer of refractory metal on the semiconductor integrated circuit structure;

forming a layer of refractory metal nitride on the refractory metal layer;

performing a first rapid thermal anneal step in nitrogen ambient to form refractory metal salicide on the source/drain regions and on the gate region;

forming a local interconnect mask to protect a portion of the refractory metal nitride layer and underlying refractory metal that extends from over a selected area of a source/drain region to the conductive element and defines a local interconnect region;

removing portions of the refractory metal nitride layer and underlying refractory metal not protected by the local interconnect mask;

removing the local interconnect mask;

performing a second rapid thermal anneal step to convert the underlying refractory metal of the local interconnect region to refractory metal nitride, and wherein the step of forming a layer of refractory metal and the step of forming a layer of refractory metal nitride are performed sequentially in-situ without breaking vacuum.

2. A method as in claim 1 and wherein the refractory metal comprises titanium and the refractory metal nitride comprises TiN.

3. A method as in claim 1 and wherein the refractory metal comprises cobalt.

4. A method as in claim 2 and wherein the titanium is about 500 Å thick and the titanium nitride is about 500 Å thick.

5. A method as in claim 1 and wherein the second rapid thermal anneal step is performed in nitrogen ambient.

* * * * *